(12) United States Patent
Kim et al.

(10) Patent No.: US 10,373,796 B2
(45) Date of Patent: Aug. 6, 2019

(54) METHOD OF INSPECTING WAFER USING ELECTRON BEAM

(71) Applicant: Samsung Electronics Co., Ltd., Suwon-si, Gyeonggi-do (KR)

(72) Inventors: Souk Kim, Seoul (KR); Chung-sam Jun, Suwon-si (KR); Woo-seok Ko, Seoul (KR); Sang-kil Lee, Yongin-si (KR); Kwang-il Shin, Suwon-si (KR); Yu-sin Yang, Seoul (KR); Min-chul Yoon, Incheon (KR)

(73) Assignee: Samsung Electronics Co., Ltd. (KR)

( * ) Notice: Subject to any disclaimer, the term of this patent is extended or adjusted under 35 U.S.C. 154(b) by 551 days.

(21) Appl. No.: 15/084,059

(22) Filed: Mar. 29, 2016

(65) Prior Publication Data

US 2016/0293379 A1   Oct. 6, 2016

(30) Foreign Application Priority Data

Mar. 30, 2015 (KR) .................. 10-2015-0044393

(51) Int. Cl.
*H01J 37/20* (2006.01)
*H01J 37/22* (2006.01)
*H01J 37/28* (2006.01)

(52) U.S. Cl.
CPC ............ *H01J 37/222* (2013.01); *H01J 37/20* (2013.01); *H01J 37/28* (2013.01); *H01J 2237/20214* (2013.01); *H01J 2237/226* (2013.01); *H01J 2237/2817* (2013.01)

(58) Field of Classification Search
CPC .. H01J 37/04; H01J 37/26; H01J 37/28; H01J 37/29; H01J 37/222; H01J 2237/24592; H01J 2237/2817; H01J 2237/04924; G06T 7/001
See application file for complete search history.

(56) References Cited

U.S. PATENT DOCUMENTS

| | | | |
|---|---|---|---|
| 6,734,428 B2 | 5/2004 | Parker et al. | |
| 6,844,550 B1 | 1/2005 | Yin et al. | |
| 6,977,375 B2 | 12/2005 | Yin et al. | |
| 7,276,690 B1 | 10/2007 | Larusso | |
| 8,139,843 B2 | 3/2012 | Kulkarni et al. | |
| 8,212,227 B2 | 7/2012 | Watanabe et al. | |
| 8,822,919 B2 | 9/2014 | Kimba et al. | |
| 2005/0244049 A1 | 11/2005 | Onishi et al. | |

(Continued)

FOREIGN PATENT DOCUMENTS

| | | |
|---|---|---|
| JP | 2006-339405 | 12/2006 |
| JP | 2013-128069 | 6/2013 |

(Continued)

*Primary Examiner* — Phillip A Johnston
*Assistant Examiner* — Hsien C Tsai
(74) *Attorney, Agent, or Firm* — Myers Bigel, P.A.

(57) ABSTRACT

A method of inspecting a wafer may include: loading of a wafer onto a stage, the wafer having a plurality of dies thereon; positioning of the wafer such that a plurality of electron beam columns on the wafer respectively face a partial region of each of the plurality of dies on the wafer; scanning the respective partial regions of each of the plurality of dies by using the electron beam columns; and combining a plurality of partial images that are obtained by scanning the partial regions to provide a die image.

20 Claims, 20 Drawing Sheets

(56) References Cited

U.S. PATENT DOCUMENTS

2007/0132578 A1 6/2007 Powell
2011/0286656 A1* 11/2011 Kulkarni ............. G06F 17/5045
                                                              382/144
2013/0336574 A1* 12/2013 Nasser-Ghodsi ....... G06T 7/001
                                                              382/145

FOREIGN PATENT DOCUMENTS

| KR | 10-2008-0005026 | 1/2008 |
| KR | 10-881631 | 1/2009 |
| KR | 10-2009-0013595 | 2/2009 |

* cited by examiner

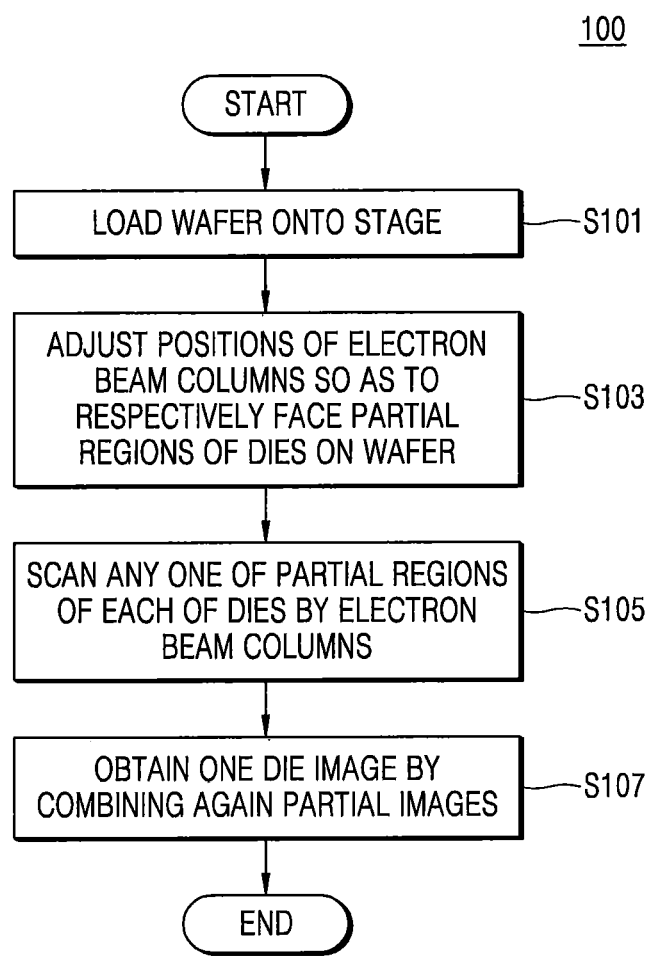

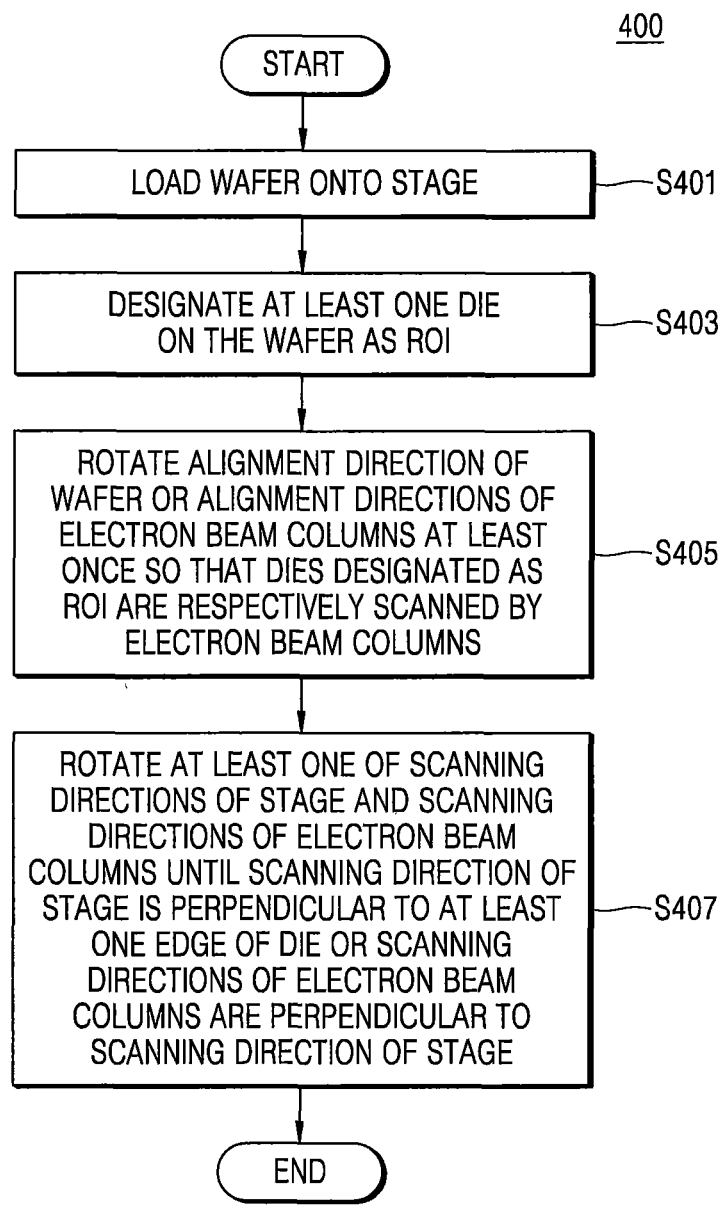

METHOD OF INSPECTING WAFER USING ELECTRON BEAM

CROSS-REFERENCE TO RELATED APPLICATION

This application claims priority to Korean Patent Application No. 10-2015-0044393, filed on Mar. 30, 2015, the disclosure of which is incorporated by reference in its entirety.

BACKGROUND

The inventive concept relates to methods of inspecting wafers using electron beams, and more particularly, to methods of inspecting wafers using a plurality of electron beam columns.

Electron beams may be used to inspect a fine pattern or a defect on the wafer at high resolution, or to analyze electrical properties of semiconductor devices. Recently, an electron beam inspection device which may emit electron beam columns has been developed which may expand a region of interest (ROI) and reduce inspection times.

SUMMARY

The inventive concept provides a method of inspecting a wafer by using a plurality of electron beam columns, which enables reducing an inspection time thereof, efficiently.

According to an aspect of the inventive concept, there is provided a method of inspecting a wafer including loading of a wafer onto a stage, the wafer having a plurality of dies thereon; positioning of the wafer such that a plurality of electron beam columns on the wafer respectively face a partial region of each of the plurality of dies on the wafer; scanning the respective partial regions of each of the plurality of dies by using the electron beam columns; and combining a plurality of partial images that are obtained by scanning the partial regions to provide a die image.

In some embodiments, the positioning of the wafer may include rotating of the wafer.

In some embodiments, the method of inspecting the wafer may further include rotating of scanning directions of the stage and the electron beam columns until the scanning direction of the stage is perpendicular to an edge of at least one of the dies and the scanning directions of the electron beam columns are perpendicular to the scanning direction of the stage.

In some embodiments, a rotation angle of the scanning directions of the stage and a rotation angle of the scanning directions of the electron beam columns may be the same as a rotation angle of the wafer.

In some embodiments, a rotation angle of the scanning directions of the stage may be determined based on movement speeds of the stage in an X-axis direction and a Y-axis direction of the stage.

In some embodiments, the positioning of the wafer may be simultaneously performed with the loading by loading the previously rotated wafer on the stage.

In some embodiments, the wafer may be rotated by a rotation stage formed on the stage.

In some embodiments, the positioning of the wafer may be rotating of alignment directions of the electron beam columns.

In some embodiments, the scanning directions of the electron beam columns may be rotated until the scanning directions of the electron beam columns are perpendicular to the scanning direction of the stage.

In some embodiments, at least one of the partial images may be obtained by scanning two of the dies.

In some embodiments, the partial region of each of the dies may be obtained by dividing each of the dies according to the number of the electron beam columns.

In some embodiments, the method of inspecting the wafer may further include detecting of a defect of a pattern of the dies, in which the detecting may include comparing the die image and design data.

In some embodiments, the detecting of the defect of the pattern may indentify at least one pattern group that is displayed repeatedly in the design data and determine a defect ratio of each of the pattern groups.

According to an aspect of the inventive concept, there is provided a method of inspecting a wafer including loading of a wafer onto a stage; designating at least one die located on the wafer as a region of interest (ROI); scanning the at least one die designated as a ROI, in which the scanning includes rotating, at least once, a wafer or an alignment direction of electron beam columns, and scanning the at least one die by using the electron beam columns; and rotating scanning directions of at least one of the stage and the electron beam columns until a scanning direction of the stage is perpendicular to an edge of at least one of the dies and the scanning directions of the electron beam columns is perpendicular to the scanning direction of the stage.

In some embodiments, the method of inspecting the wafer may further include detecting of defects of a plurality of images of the dies, in which the detecting may include comparing a plurality of images of the dies which are obtained by respectively scanning the dies designated as ROIs.

According to an aspect of the inventive concept, a method of inspecting a wafer having a plurality of dies thereon includes generating a plurality of electron beam columns such that the plurality of electron beam columns face a partial region of each of the plurality of dies on the wafer; scanning the respective partial regions of each of the plurality of dies by using the electron beam columns; and combining a plurality of partial images that are obtained by scanning the respective partial regions to provide a die image.

In some embodiments, the scanning comprises rotating scanning directions of at least one of a stage on which the wafer is positioned and the electron beam columns until a scanning direction of the stage is perpendicular to an edge of at least one of the dies and the scanning directions of the electron beam columns are perpendicular to the scanning direction of the stage.

In some embodiments, the method includes comparing the die image to design data, and detecting a defect pattern based on the comparison.

In some embodiments, the method includes indentifying at least one pattern group that is displayed repeatedly in the design data and determining a defect ratio of the at least one pattern group.

In some embodiments, the partial region of one of the plurality of dies is different from the partial region of at least one other of the plurality of dies.

BRIEF DESCRIPTION OF THE DRAWINGS

Example embodiments of the inventive concept will be more clearly understood from the following detailed description taken in conjunction with the accompanying drawings in which:

FIG. 1 is a flowchart of a method of inspecting a wafer according to example embodiments;

FIG. 16 is a flowchart of a method of inspecting a wafer when a plurality of dies are a region of interest (ROI), according to example embodiments;

DETAILED DESCRIPTION OF THE EMBODIMENTS

Figure 2A:
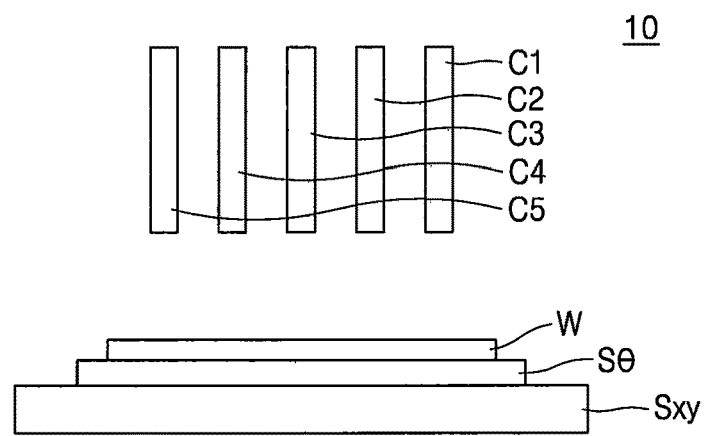
FIGS. 2A and 2B ale schematic views illustrating wafer scanning using electron beam columns according to example embodiments.

The inventive concept will be described more fully hereinafter with reference to the accompanying drawings, in which example embodiments of the inventive concept are shown. This inventive concept may, however, be embodied in many different forms and should not be construed as limited to the example embodiments set forth herein. Rather, these example embodiments are provided so that this disclosure will be thorough and complete, and will fully convey the scope of the inventive concept to those of ordinary skilled in the art. In the drawings, the sizes of layers and regions may be exaggerated for clarity. The same reference numerals are used to denote the same elements, and repeated descriptions thereof will be omitted.

It will be understood that, although the terms "first," "second," etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined as commonly used dictionaries, should be interpreted as having a meaning that is consistent with their meaning in the context of the relevant art and this specification and will not be interpreted in an idealized or overly formal sense unless explicitly so defined herein.

When some embodiments may be embodied otherwise, respective process steps described herein may be performed otherwise. For example, two process steps described in a sequential order may be performed substantially the same time or in reverse order.

Variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing.

In addition, sizes of components in the drawings may be exaggerated for convenience of explanation. In other words, since sizes and thicknesses of components in the drawings are arbitrarily illustrated for convenience of explanation, the following embodiments are not limited thereto.

As used herein, the term "and/or" includes any and all combinations of one or more of the associated listed items. Expressions such as "at least one of," when preceding a list of elements, modify the entire list of elements and do not modify the individual elements of the list.

Figure 2B:
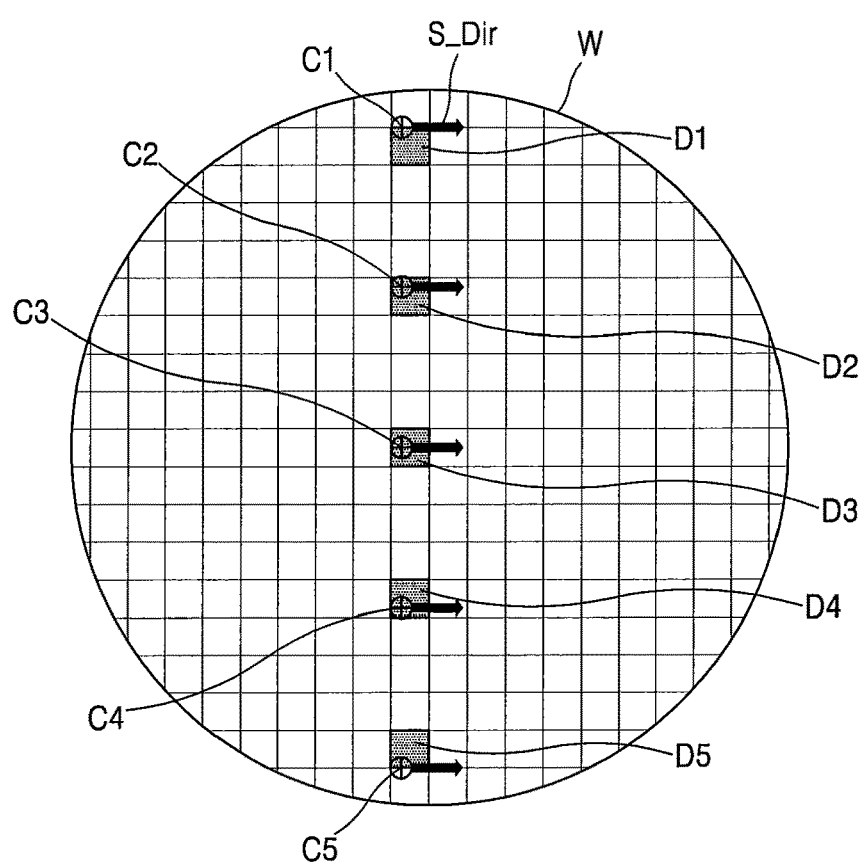

FIG. 1 is a flowchart of a wafer inspection method 100 according to example embodiments. FIGS. 2A and 2B are schematic views illustrating wafer scanning using electron beam columns according to example embodiments.

Referring to FIG. 1, FIGS. 2A and 2B, the wafer inspection method 100 according to example embodiments may use an electron beam inspection device 10 which may emit electron beam columns C1 to C5.

The electron beam inspection device 10 may include a stage Sxy supporting wafer W to be inspected; and the electron beam columns C1 to C5, which may be on the stage Sxy, furthermore, generate and emit an electron beam toward the wafer W. The electron beam inspection device 10 may further include a detector (not shown) for detecting signals emitted from the wafer W.

First, in the wafer inspection method 100 according to example embodiments, the wafer W is loaded onto the stage Sxy in a chamber (S101). The stage Sxy may support the wafer W, and each point on the wafer W may be scanned by moving the stage Sxy in an X-direction and a Y-direction, respectively. Furthermore, a magnification level may be adjusted by moving the stage Sxy in a Z-direction. The stage Sxy may include a rotation stage $S_\theta$ for rotating the wafer W and the wafer W may be loaded onto the rotation stage $S_\theta$. The electron beam columns C1 to C5 may be disposed on the wafer W.

Each of the electron beam columns C1 to C5 may generate and emit an electron beam towards the wafer W to be inspected by accelerating and focusing the electron beam. Signals are emitted due to an interaction between the wafer W and the electron beam, and the emitted signals are detected by the detector and converted into a wafer image. The electron beam columns C1 to C5 may be spaced apart from each other. Thus, multiple locations on the wafer W may be scanned simultaneously.

Figure 3:
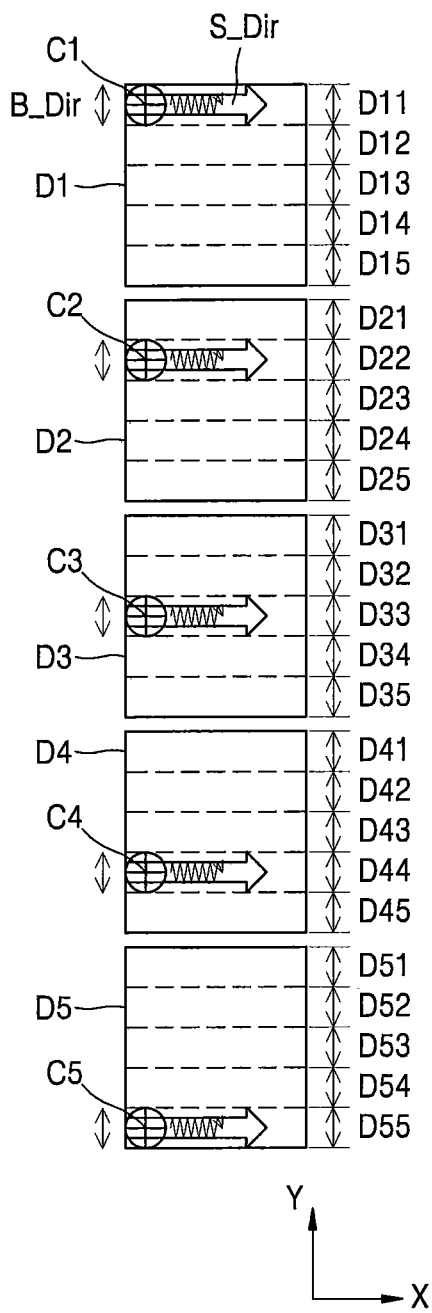
FIG. 3 is a view illustrating scanning of a partial region of each die on a wafer by the electron beam columns of FIGS. 2A and 2B.

FIG. 3 is a view illustrating scanning of a partial region of each die on a wafer by the electron beam columns of FIGS. 2A and 2B.

Referring to FIG. 1, FIG. 2B and FIG. 3, positions of the electron beam columns C1 to C5 may be adjusted so as to respectively face partial regions D11, D22, D33, D44, and D55 of dies D1 to D5 on the wafer W (S103). The partial region of one of the plurality of dies D1 to D5 is different from that of another of the plurality of dies D1 to D5. Accordingly, partial images may be obtained by scanning each of the partial regions, and a die image may be obtained in a shorter amount of time by combining the partial images.

The electron beam columns C1 to C5 may be respectively disposed on the dies D1 to D5. The dies D1 to D5 may be spaced apart from each other, and each of the dies D1 to D5 may be divided into five partial regions of equal size. Simultaneously, the electron beam columns C1 to C5 may scan any one of the partial regions of each of the dies (S105).

The first electron beam column C1 may be disposed on the first die D1 and scan the first partial region D11 from among the partial regions D11 to D15. The second electron beam column C2 is disposed on the second die D2 and scans a second partial region D22 from among partial regions D21 to D25. Similarly, the third electron beam column C3 is disposed on third partial region D33 from among partial regions D31 to D35 of the third die D3, the fourth electron beam column C4 is disposed on fourth partial region D44 from among partial regions D41 to D45 of the fourth die D4, and the fifth electron beam column C5 is disposed on fifth partial region D55 from among partial regions D51 to D55 of the fifth die D5.

In the exemplary embodiments of FIG. 3, the electron beam columns C1 to C5 may be spaced apart with a constant interval therebetween. However the example embodiments are not limited thereto. By using an electron beam inspection device capable of freely adjusting positions of the electron beam columns C1 to C5, intervals between the electron beam columns C1 to C5 may be varied. Accordingly, the first electron beam column C1 may scan the fifth partial region D15 rather than the first partial region D11, the second electron beam column C2 may scan the first partial region D21 rather than the second partial region D22, the third electron beam column C3 may scan the fourth partial region D34, the fourth electron beam column C4 may scan the second partial region C42, and the fifth electron beam column C5 may scan the third partial region 53.

In other words, the electron beam columns C1 to C5 may respectively scan any of the partial regions. In some embodiments, it may be sufficient to scan one of the dies from a point of view of the entire electron beam columns C1 to C5 but specific positions of the partial regions to be scanned are not limited thereto.

Scanning directions B_Dir of the electron beam columns C1 to C5 may be perpendicular to any edge of the dies D1 to D5 (i.e., a Y-direction of FIG. 3), and a scanning direction S_Dir of scanning the stage Sxy, which supports the wafer W including the dies D1 to D5, may be perpendicular to the scanning directions B_Dir of the electron beam columns C1 to C5 (i.e., an X-direction of FIG. 3).

Figure 4:
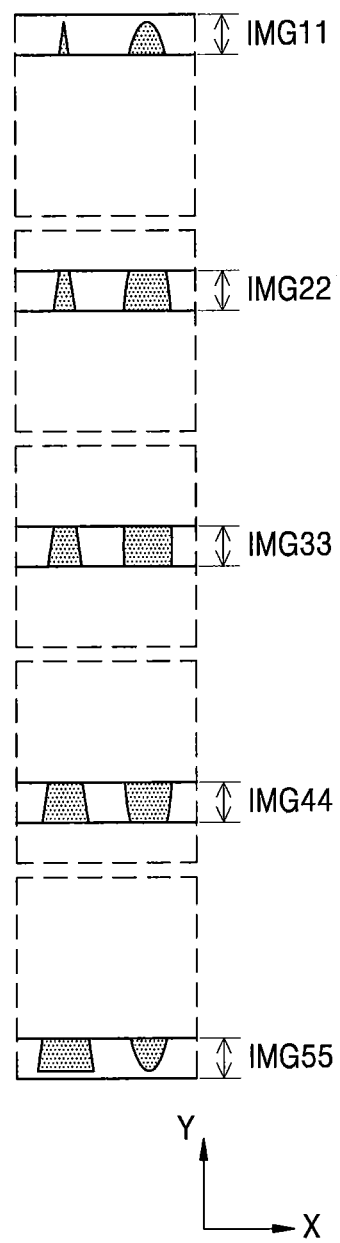
FIG. 4 is a view of partial images corresponding to each of the partial regions in FIG. 3.

FIG. 4 is a view of partial images corresponding to each of the partial regions in FIG. 3.

Referring to FIGS. 1 and 4, partial images IMG11, IMG22, IMG33, IMG44, and IMG55 may be obtained from the partial regions D11, D22, D33, D44, and D55 which are scanned by the electron beam columns C1 to C5, respectively. The partial images IMG11, IMG22, IMG33, IMG44, and IMG55, which are obtained by equally dividing one of the dies, may be combined into a die image.

When using only a single electron beam column, thoroughly scanning a die when forming a die image may take longer (e.g., five times longer in the current example, depending on the number of electron beam columns used) than when using multiple electron beam columns which respectively obtain partial images (e.g., images of the partial regions).

Furthermore, since the electron beam columns respectively and simultaneously scan the dies, it is possible to respectively and simultaneously form five images of five of the dies even by a general inspection method using an electron beam inspection device which may emit electron beam columns. However, an inspection time thereof may take five times longer than that of example embodiments.

Figure 5:
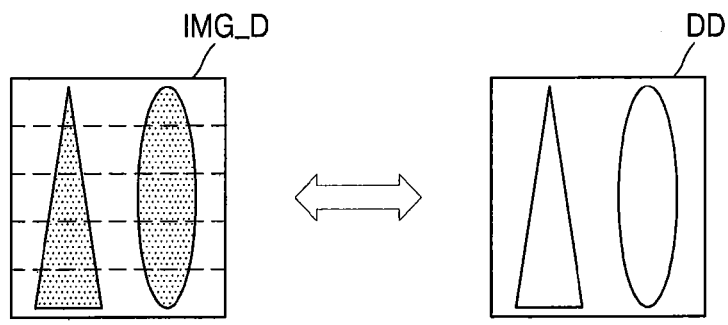
FIG. 5 is a view illustrating a comparison of design data and a die image that is obtained by combining the partial images of FIG. 4.

FIG. 5 is a view illustrating a comparison of design data and a die image that is obtained by combining the partial images of FIG. 4.

Referring to FIG. 5, a die image IMG_D may be obtained by combining again the partial images IMG11, IMG22, IMG33, IMG44, and IMG55 of FIG. 4 (S107). The obtained die image IMG_D may be used as a sample representing a die actually manufactured according to design data DD. Due to the limits of processing techniques, the die manufactured according to the design data DD may be different from the design data DD or have one or more defects. Therefore, the die image IMG_D may be used to modify the design data DD based on a comparison of the design data DD and analyzing the result.

In detail, repeated patterns may exist in one die, and based on defect occurrence rates of all repeated patterns in the die image IMG_D, a pattern having a higher defect occurrence rate compared to other patterns may be used to correct the design data DD. By comparing and analyzing the die image IMG_D and the design data DD, defects in the design data DD can be found and corrected before mass production of the die, which may be advantageous in configuring equipment prior to die manufacture. In some embodiments, a defect in the design data DD may be analyzed by comparing the die image IMG_D with each point of the design data DD, respectively. In other words, a designer may recognize high defect occurrence rates of some specific patterns in the dies. It can be determined from the comparison the die image IMG_D does not correspond with the design data DD. The designer can correct or modify the specific patterns which result in high defect occurrence rates to reduce the defect rates.

As the wafer inspection method 100 according to the inventive concept can obtain the die image IMG_D used for the inspection in a short amount of time, the total inspection time may be reduced. As for the comparison of the die image IMG_D with the design data DD and analysis of the results, the comparison will be described below in detail with reference to FIGS. 13 to 15.

The number of the electron beam columns C1 to C5 is five in FIGS. 2A to 5, but the example embodiments are not limited thereto. In some embodiments, the number of the electron beam columns may be two to four, or at least six. Therefore, the partial regions which are to be scanned may be determined according to the number of the electron beam columns. Furthermore, the electron beam columns C1 to C5 are arranged in a row in FIGS. 2A to 5, but the example embodiments are not limited thereto. The electron beam columns C1 to C5 may have a variety of arrangements.

The wafer inspection method 100 of FIGS. 1 to 5 may be used when the positions of the electron beam columns C1 to C5 included in the electron beam inspection device 10 can be freely adjusted. When an electron beam inspection device in which intervals between a plurality of electron beam columns are fixed is used for the wafer inspection method 100, only dies having partial regions spaced apart by the intervals and disposed under the electron beam columns may be inspected.

Figure 6:
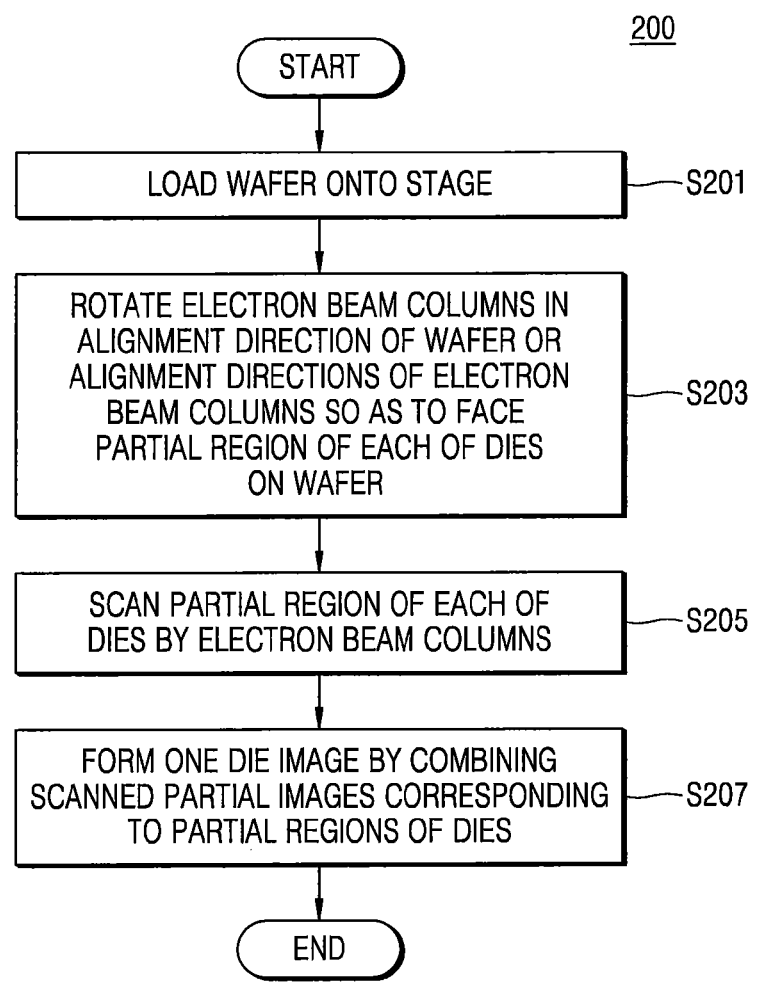
FIG. 6 is a flowchart of a method of inspecting the wafer according to example embodiments.

FIG. 6 is a flowchart of a wafer inspection method 200 according to example embodiments. The wafer inspection method 200 is similar to the wafer inspection method 100 described with reference to FIGS. 1 to 5, but there is a difference in operation S203 of rotating an alignment direction of the wafer or alignment directions of the electron beam columns in order to adjust the positions of the electron beam columns. In other words, the wafer inspection method 200 may be used when intervals between the electron beam columns are not arbitrarily adjusted.

Figure 7:
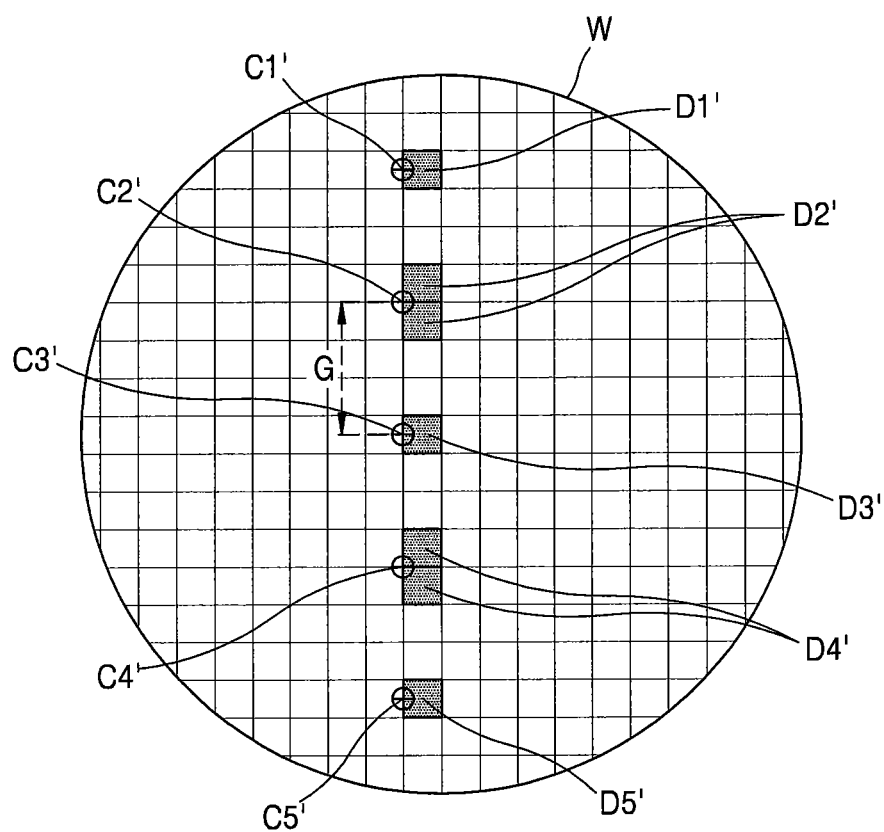
FIG. 7 is a schematic view illustrating positions of a plurality of electron beam columns on a wafer when intervals between the electron beam columns are not arbitrarily adjusted.
Figure 8:
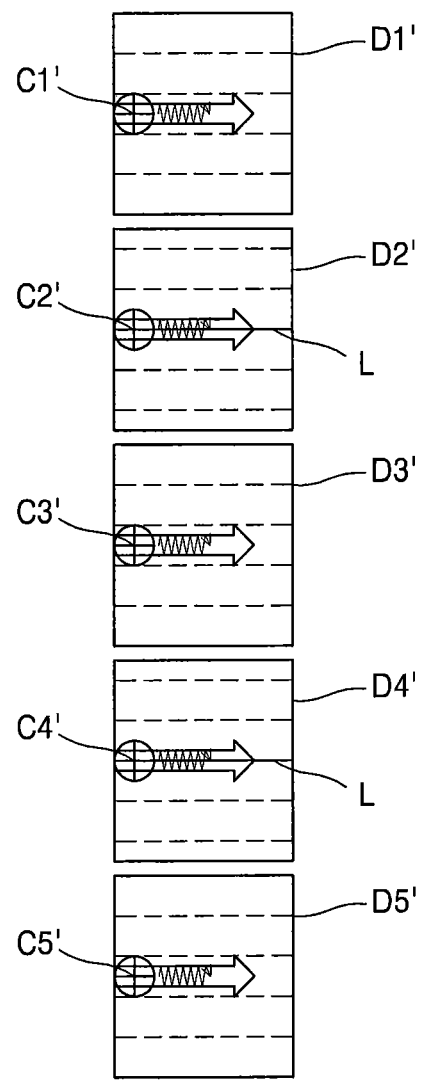
FIG. 8 is a view illustrating scanning of regions of the dies on the wafer where the electron beam columns of FIG. 7 overlap.

FIG. 7 is a schematic view illustrating positions of a plurality of electron beam columns on a wafer when intervals between the electron beam columns are not arbitrarily adjusted. FIG. 8 is a view illustrating scanning of regions of the dies on the wafer where the electron beam columns of FIG. 7 overlap.

Referring to FIGS. 7 and 8, the plurality of electron beam columns C1' to C5' are respectively disposed on the dies D1' to D5'. However, all of the electron beam columns C1' to C5' are not respectively disposed on each of the dies and several of the electron beam columns may overlap along regions of each of the dies.

In other words, the first, third, and fifth electron beam columns C1', C3', and C5' may overlap along the central region of the first, third, and fifth dies D1', D3', and D5', and the second and fourth electron beam columns C2' and C4' may overlap along a boundary L of the second and fourth dies D2' and D4'.

Accordingly, the electron beam columns C1' to C5' may be unable to scan some partial regions of the die, and thus additional scanning may be required for the partial regions which are unable to scanned. Therefore, an additional inspection time will be required.

Therefore, even when the intervals between the electron beam columns C1' to C5' are not arbitrarily adjusted, a die image may be formed in a short amount of time by scanning partial regions that are divided by the number of the electron beam columns by the electron beam columns C1' to C5'.

Figure 9:
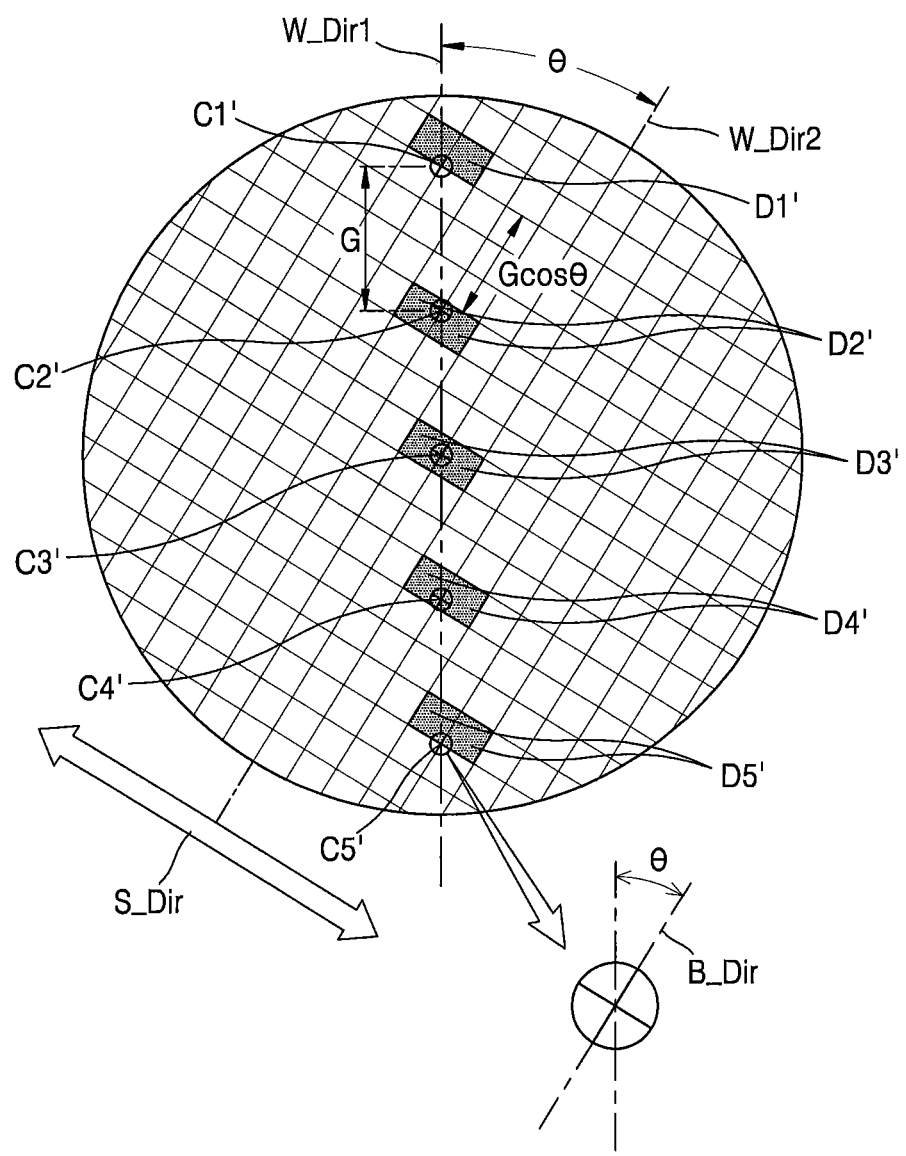
FIG. 9 is a schematic view illustrating positions of a plurality of electron beam columns incident on a wafer when a wafer is rotated according to example embodiments.

FIG. 9 is a schematic view illustrating positions of a plurality of electron beam columns on a wafer when the wafer is rotated according to example embodiments.

Referring to FIGS. 2A, 6, and 9, the wafer W is loaded onto the stage Sxy in the chamber by the wafer inspection method 200 according to example embodiments (S201). The stage Sxy may support the wafer W, and each point on the wafer W may be scanned by moving the stage Sxy in an X-direction and a Y-direction. The rotation stage $S_\theta$ rotating the wafer W may be further included on the stage Sxy, and the wafer W may be loaded onto the rotation stage $S_\theta$. The electron beam columns C1 to C5 spaced apart at fixed intervals may be disposed on the wafer W. Although the positions of the electron beam columns C1 to C5 as illustrated in FIG. 2A are adjustable, for convenience of explanation, the electron beam columns C1' to C5' in FIG. 9 are described as being spaced apart at fixed intervals.

The electron beam columns C1' to C5' may rotate in the alignment direction of the wafer W or the alignment directions of the electron beam columns C1' to C5' so as to face the partial region of each of the dies on the wafer (S203).

The wafer W may rotate at a specific angle θ from a first reference direction W_Dir1 to a second reference direction W_Dir2. The specific angle θ is a value that is calculated so that the electron beam columns C1' to C5' are incident on the partial region of each of the dies, respectively. In other words, even if the electron beam columns C1' to C5' are spaced apart at fixed intervals G, the electron beam columns C1' to C5' may be spaced apart at adjusted intervals of G*cosθ based on the second reference direction W_Dir2 when the wafer W is rotated by the specific angle θ. Therefore, as described above with reference to FIGS. 1 to 5, the electron beam columns C1' to C5' may be the same as defined with respect to the electron columns C1 to C5, and are capable of adjusting the intervals thereof.

In some embodiments, the wafer W may be loaded onto the stage Sxy by rotating the wafer W in advance by the specific angle θ. In other words, operation S203 of adjusting the position of the wafer W by rotation thereof may be simultaneously performed with operation S201.

In some embodiments, the wafer W may be rotated by the specific angle θ by the rotation stage $S_\theta$ formed on the stage Sxy.

An operation of rotating the scanning direction of scanning the stage Sxy and the scanning directions of the electron beam columns C1' to C5' may be further included. Based on the rotation of the scanning directions, edge boundaries of the die may match boundaries of an image that is obtained by scanning.

Therefore, rotation of the scanning direction S_Dir of scanning the stage Sxy and the scanning directions B_Dir of the electron beam columns C1' to C5' may be performed simultaneously. That is, the scanning direction S_Dir of scanning the stage Sxy and the scanning directions B_Dir of the electron beam columns C1' to C5' are rotated, such that the scanning direction S_Dir of scanning the stage Sxy is perpendicular to any edge of the die and the scanning directions B_Dir of the electron beam columns C1' to C5' are perpendicular to the scanning direction S_Dir of scanning the stage Sxy.

In some embodiments, the scanning direction S_Dir of scanning the stage Sxy and the scanning directions B_Dir of the electron beam columns C1' to C5' may be rotated by an angle θ equal to a rotation angle of the wafer W.

The rotation in the scanning direction of scanning the stage Sxy may be realized by a combination of movement speeds of the stage Sxy in an X-axis direction and in a Y-axis direction of scanning the stage Sxy.

The rotation in the scanning directions B_Dir of the electron beam columns C1' to C5' may be realized by controlling voltages which move the stage Sxy in the X-axis direction and the Y-axis direction. In other words, the scanning directions B_Dir of the electron beam columns C1' to C5' may be rotated by the specific angle θ from the alignment directions of the electron beam columns C1' to C5'.

The wafer W being rotated in the alignment directions of the electron beam columns C1' to C5' is illustrated in FIG. 9, but the exemplary embodiments are not limited thereto. In some embodiments, the electron beam columns C1' to C5' may rotate in the alignment directions of the electron beam columns C1' to C5' corresponding to the wafer W such that the electron beam columns C1' to C5' are incident the partial region of each of the dies on the wafer W, respectively.

The scanning directions B_Dir of the electron beam columns C1' to C5' may be rotated so as to be perpendicular to the scanning direction S_Dir of scanning the stage Sxy. However, the rotation in the scanning direction S_Dir of scanning the stage Sxy may be omitted.

In a general loading operation of the wafer W, the wafer Wa may be loaded such that a boundary of any one edge of the dies in the wafer W is perpendicular to the scanning direction S_Dir of scanning the stage Sxy. When there is no artificial rotation of the wafer W, the scanning direction S_Dir of scanning the wafer W and the stage Sxy may be set so as to match the boundary of the image with the boundary of the edge of the dies. Therefore, when the scanning directions B_Dir of the electron beam columns C1' to C5' are rotated, the rotating in the scanning direction S_Dir of scanning the stage Sxy may be omitted, unlike when the wafer W is rotated.

After rotating the alignment direction of the wafer W or the alignment directions of the electron beam columns C1' to C5', the electron beam columns C1' to C5' may scan the partial region of each of the dies, respectively (S205).

Figure 10:
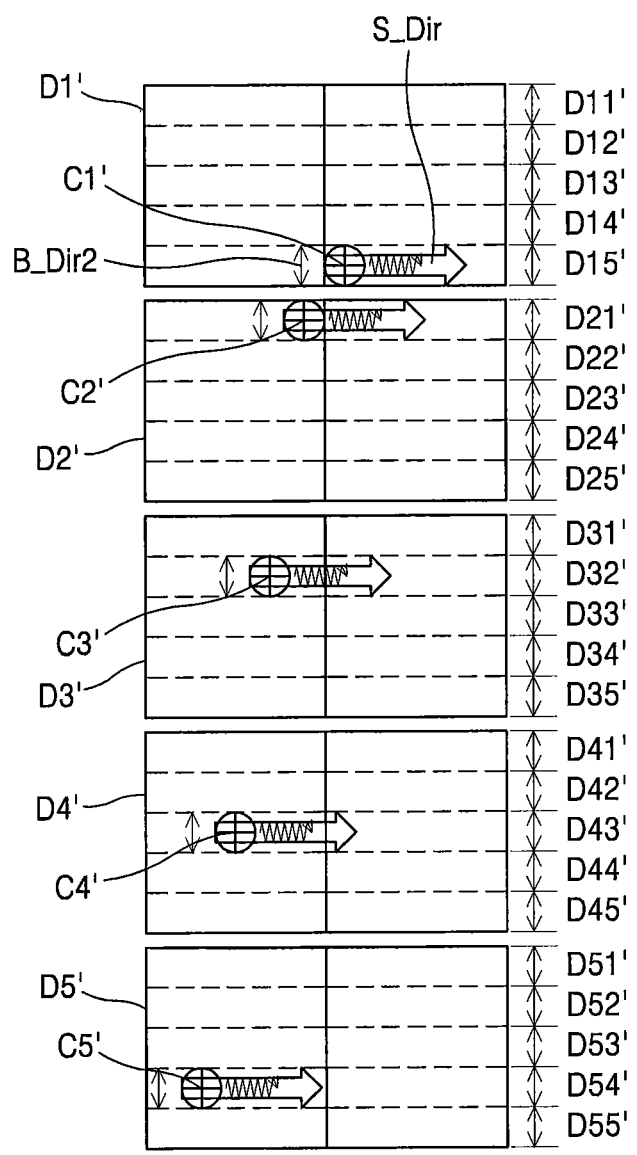
FIG. 10 is a view illustrating scanning of a partial region of each of a plurality of dies on the wafer by the electron beam columns of FIG. 9.

FIG. 10 is a view illustrating scanning of regions of the dies on the wafer where the electron beam columns of FIG. 9 overlap.

Referring to FIGS. 9 and 10, even though the electron beam columns C1' to C5' have fixed intervals in G, the intervals between the electron beam columns C1' to C5' may be adjusted by G*cosθ by rotating the wafer W or the alignment directions of the electron beam columns C1' to C5' in the alignment direction of the wafer W or the alignment directions of the electron beam columns C1' to C5'.

The electron beam columns C1' to C5' may adjust the intervals therebetween so as to face partial regions D15', D21', D32', D43', and D54' of each of the dies D1' to D5' on the wafer W, respectively. Accordingly, the electron beam columns C1' to C5' may respectively scan the partial regions D15', D21', D32', D43', and D54' and obtain the partial images thereof. Thus, the electron beam columns C1' to C5' may obtain a die image in a relatively short amount of time by combining the partial images.

For example, the electron beam columns C1' to C5' may be respectively disposed on the dies D1' to D5' which are spaced apart from each other at predetermined intervals based on alignment directions of the dies. The electron beam columns C1' to C5' may scan any one of the five partial regions of each of the dies, respectively.

The first electron beam column C1' is disposed on the first die D1' and may scan the fifth partial region D15' from among partial regions D11' to D15' which are equally divided into five of the first die D1'. The second electron beam column C2' is disposed on two parts of the second die D2' and may scan the first partial region D21' from among partial regions D21' to D25' which are equally divided into five of the second die D2'. Similarly, the third electron beam column C3' is disposed on the second partial region D32' from among partial regions D21' to D25' of two parts of the third die D3'. The fourth electron beam column C4' is disposed on the third partial region D43' from among partial regions D41' to D45' of two parts of the fourth die D4'. The fifth electron beam column C5' is disposed on the fourth partial region D54' from among partial regions D51' to D55' of two parts of the fifth die D5'.

The second to fifth electron beam columns C2' to C5' scan over the two parts of each of the dies. As each of the dies includes an identical pattern and combines the partial images again later, it is possible that one of the electron beam columns scans over two parts of each of the dies. In other words, it is enough to thoroughly scan one of the dies from a point of view of the entire electron beam columns C1' to C5' and specific positions of the partial regions to be scanned are not limited thereto.

The scanning directions B_Dir of the electron beam columns C1' to C5' may be rotated by the specific angle θ by which the wafer W is rotated. This is a direction perpendicular to the edge of the dies D1' to D5' and the scanning direction S_Dir of scanning the stage Sxy moving the dies D1' to D5' may be perpendicular to the scanning directions B_Dir of the electron beam columns C1' to C5'.

Figure 11:
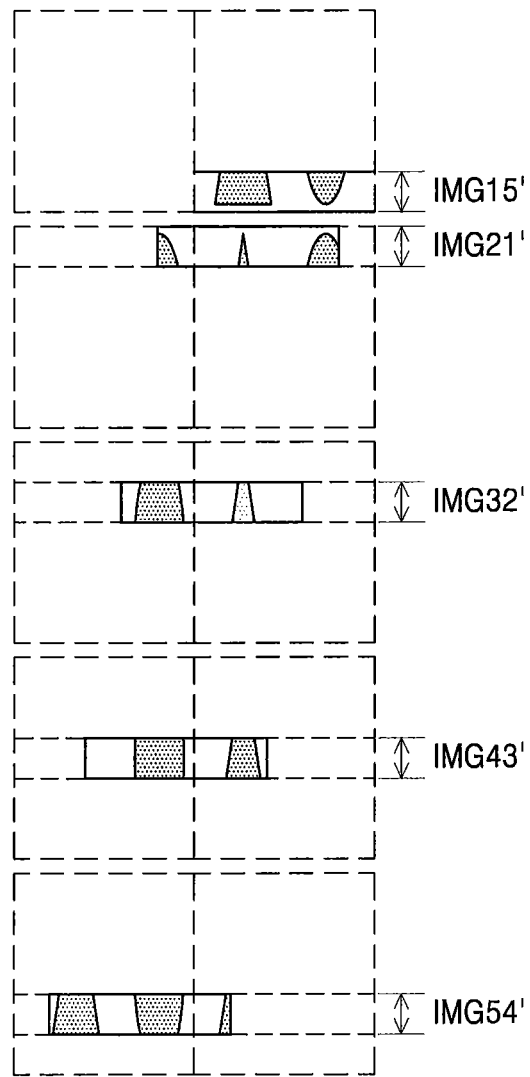
FIG. 11 is a view illustrating partial images corresponding to each of the partial regions in FIG. 10.

FIG. 11 is a view illustrating partial images corresponding to each of the partial regions in FIG. 10.

Referring to FIGS. 6 and 11, partial images IMG15', IMG21', IMG32', IMG43', and IMG54' may be respectively obtained from the partial regions D15', D21', D32', D43', and D54' which are respectively scanned by the electron beam columns C1' to C5'. The partial images IMG15', IMG21', IMG32', IMG43', and IMG54' may be formed of one die image by combining the scanned partial images IMG15', IMG21', IMG32', IMG43', and IMG54' corresponding to the partial regions of the dies. (S207).

As described above, according to the wafer inspection method 200 of example embodiments, as the electron beam columns C1' to C5' form a die image by obtaining only the partial images IMG15', IMG21', IMG32', IMG43', and IMG54' of the dies and combining them again, an inspection time may be reduced to about 1/5 times the inspection time required when one of the electron beam columns scans over the one of the dies. Furthermore, according to the wafer inspection method 200 of example embodiments, even when the intervals between the electron beam columns C1' to C5' are fixed, it is possible to have an effect that the intervals are adjusted by rotating the alignment direction of the wafer or the alignment directions of the electron beam columns. Therefore, any kind of electron beam inspection devices may be used.

Figure 12:
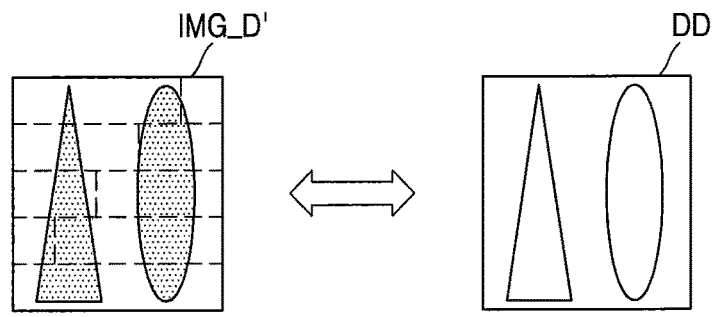
FIG. 12 is a view illustrating a comparison of design data and a die image that is obtained by combining the partial images of FIG. 11.

FIG. 12 is a view illustrating a comparison of design data and a die image that is obtained by combining the partial images of FIG. 11.

Referring to FIGS. 6 and 12, a die image IMG_D' may be obtained by combining the partial images IMG15', IMG21', IMG32', IMG43', and IMG54' of FIG. 11 again (S207).

As described above, the obtained die image IMG_D' may be used as a sample representing a die actually manufactured by design data DD. In other words, the die image IMG_D' may be used to modify the design data DD based on a comparison of the design data DD and analyzing the result. Accordingly, equipment may be setup in advance based on defects in the design data DD which are found and corrected in advance. It will be described in detail with reference to FIGS. 13 to 15 about the comparing with the design data DD and analyzing the result.

Figure 13:
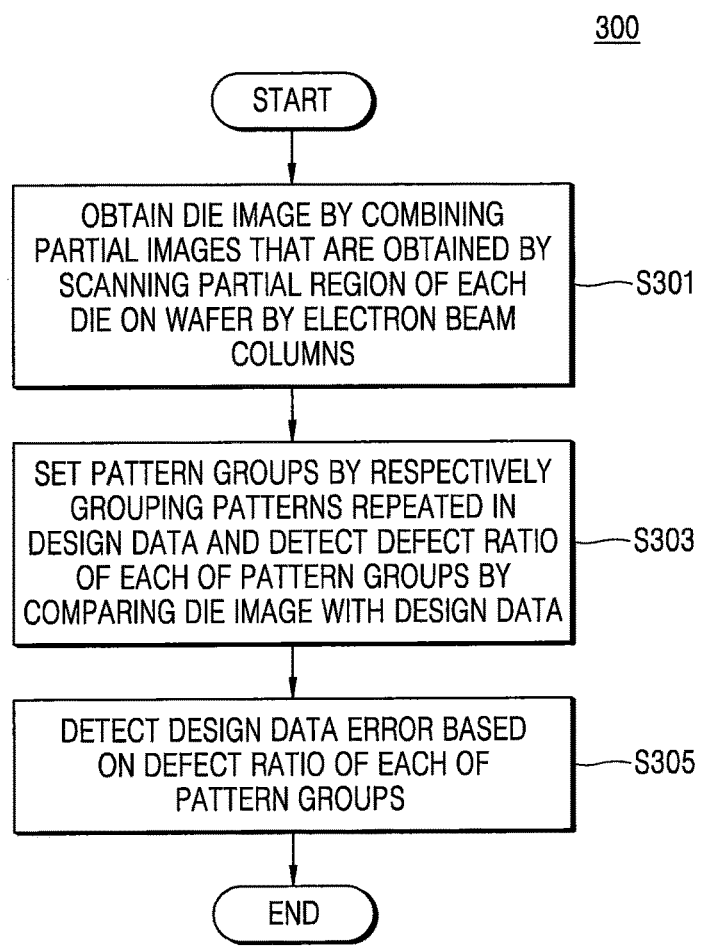
FIG. 13 is a flowchart of a method of inspecting design data according to example embodiments.

FIG. 13 is a flowchart of a design data-inspection method 300 according to example embodiments.

Referring to FIG. 13, a die image may be obtained by combining partial images that are obtained by scanning a partial region of each die on a wafer by electron beam columns (S301). S301 operation is performed by the wafer inspection method 100 described with reference to FIGS. 1 to 5 or the wafer inspection method 200 described with reference to FIGS. 6 to 12.

Since then, pattern groups may be set by respectively grouping patterns repeated in the design data and detect a defect ratio of each of the pattern groups by comparing the die image with the design data (S303).

Design data error may be detected based on the defect ratio of each of the pattern groups (S305). In other words, a pattern of the pattern groups having a relatively higher defect ratio is regarded as having a design data error and its design data may be corrected.

Figure 14:
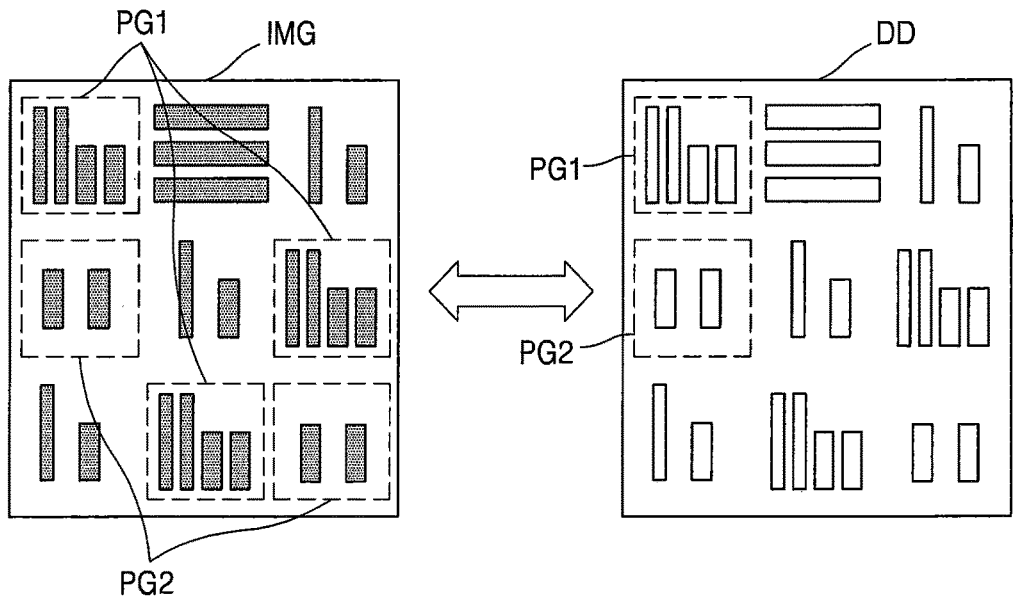
FIG. 14 is a view illustrating a comparison of repeated patterns displayed on a die image according to example embodiments and design data.

FIG. 14 is a view illustrating a comparison of repeated patterns displayed on a die image according to example embodiments and design data. FIGS. 4 and 5, 10 and 11 simply illustrate the patterns on the die image for convenience of explanation, but the die image may have a plurality of the patterns that are repeated as illustrated in FIG. 14, actually.

Referring to FIGS. 13 and 14, a die image IMG formed by obtaining of the die image (S301) and the design data DD of the die image IMG are illustrated.

Referring to the design data DD, a plurality of repeated patterns may be displayed on the die. The repeated patterns may be set as pattern groups PG1 and PG2 by respectively grouping thereof. The plurality of the repeated patterns corresponding to the pattern groups PG1 and PG2 may be displayed in actual results manufactured based on the design data DD, and the defect ratio may be detected with respect to each of the pattern groups PG1 and PG2.

Figure 15:
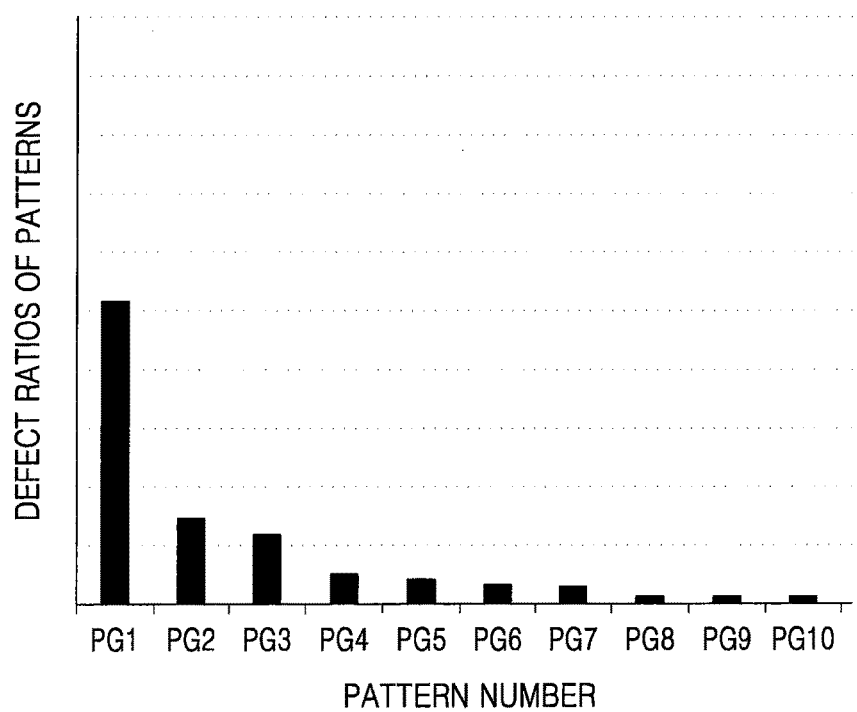
FIG. 15 is a graph of defect ratios of patterns according to each of the repeated patterns.

FIG. 15 is a graph of defect ratios of patterns according to each of the repeated patterns.

Referring to FIG. 15, first to tenth pattern groups are set by respectively grouping patterns repeated in a die and a defect ratio of each of the first to tenth pattern groups is illustrated.

A defect ratio of a first pattern group PG1 is markedly higher than those of second to tenth pattern groups. Therefore, design data corresponding to the pattern of the first pattern group PG1 may be corrected.

As described above, the design data-inspection method 300 comparing the die image with the design data and analyzing the results according to example embodiments may detect and correct the design data error before mass production of the results, thus equipment may be setup in advance. Furthermore, according to the wafer inspection methods 100 and 200 described with reference to FIGS. 1 to 12, it is possible to obtain the die image that is used for the design data-inspection method 300 in a short amount of time and an inspection time of the design data-inspection method 300 may be reduced.

FIG. 16 is a flowchart of a wafer inspection method 400 when a plurality of dies is a region of interest (ROI), according to example embodiments. The wafer inspection methods 100 and 200 of FIGS. 1 to 12 are for obtaining a die image in a short amount of time, however, the wafer inspection method 400 of FIG. 16 is for obtaining a plurality of die images in a short amount of time corresponding to a designated ROI.

Referring to FIGS. 2A and 16, by the wafer inspection method 400 according to example embodiments, the wafer W is loaded onto the stage Sxy (S401), and at least one die located on the wafer W is designated as an ROI (S403).

Since then, the alignment direction of the wafer or the alignment directions of the electron beam columns may be rotated at least once so that the dies designated as the ROI are respectively scanned by the electron beam columns (S405). S405 operation is for effectively using the electron beam columns introduced to reduce the inspection time.

After rotating the alignment direction of the wafer or the alignment directions of the electron beam columns, at least one of the scanning directions of the stage and the scanning directions of the electron beam columns may be rotated until the scanning direction of the stage is perpendicular to at least one edge of the die or the scanning directions of the electron beam columns are perpendicular to the scanning direction of the stage (S407). The operation of rotating the scanning direction of the stage and/or the alignment directions of the electron beam columns is for matching the boundary of the image obtained by scanning with the edge boundary of the die.

In some embodiments, the scanning direction of the stage may be determined by the combination of the movement speed in the X-axis direction of the stage and the movement speed in the Y-axis direction of the stage.

In general, an inspection speed may be improved as the number of the electron beam columns increases. However, since the wafer has a circular shape, the inspection speed may not be improved as the number of the electron beam columns increases even if the electron beam columns are added perpendicular or horizontally to the wafer.

The wafer inspection method 400 according to example embodiments improves an actual scanning rate of the electron beam columns in the scanning operation that is performed over a plurality of times, by rotating the alignment directions of the electron beam columns. Therefore, by the rotating operation of the wafer or the electron beam columns, the wafer or the electronic columns may rotate more than once so as to minimize the number of scanning of the ROI.

Figure 17A:
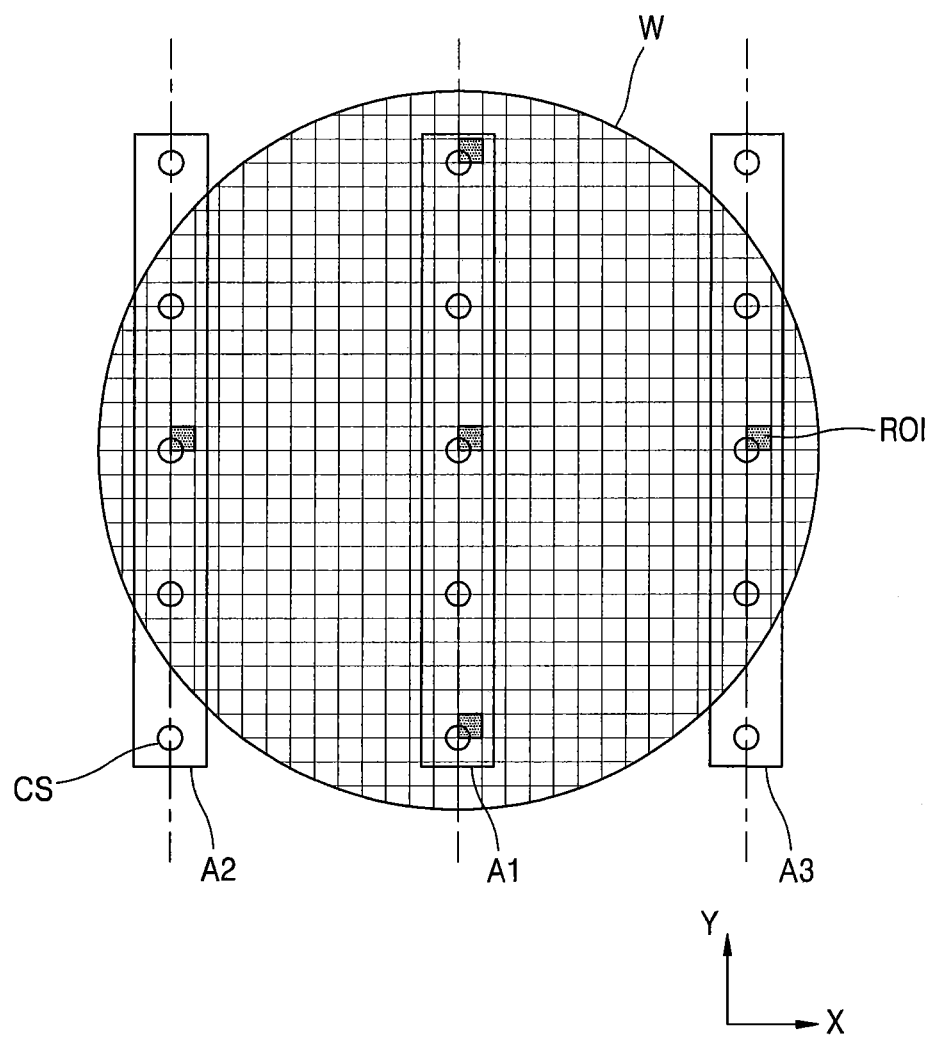
FIGS. 17A and 17B are views illustrating a comparison of alignment directions of electron beam columns on an ROI according to a general case and example embodiments.
Figure 17B:
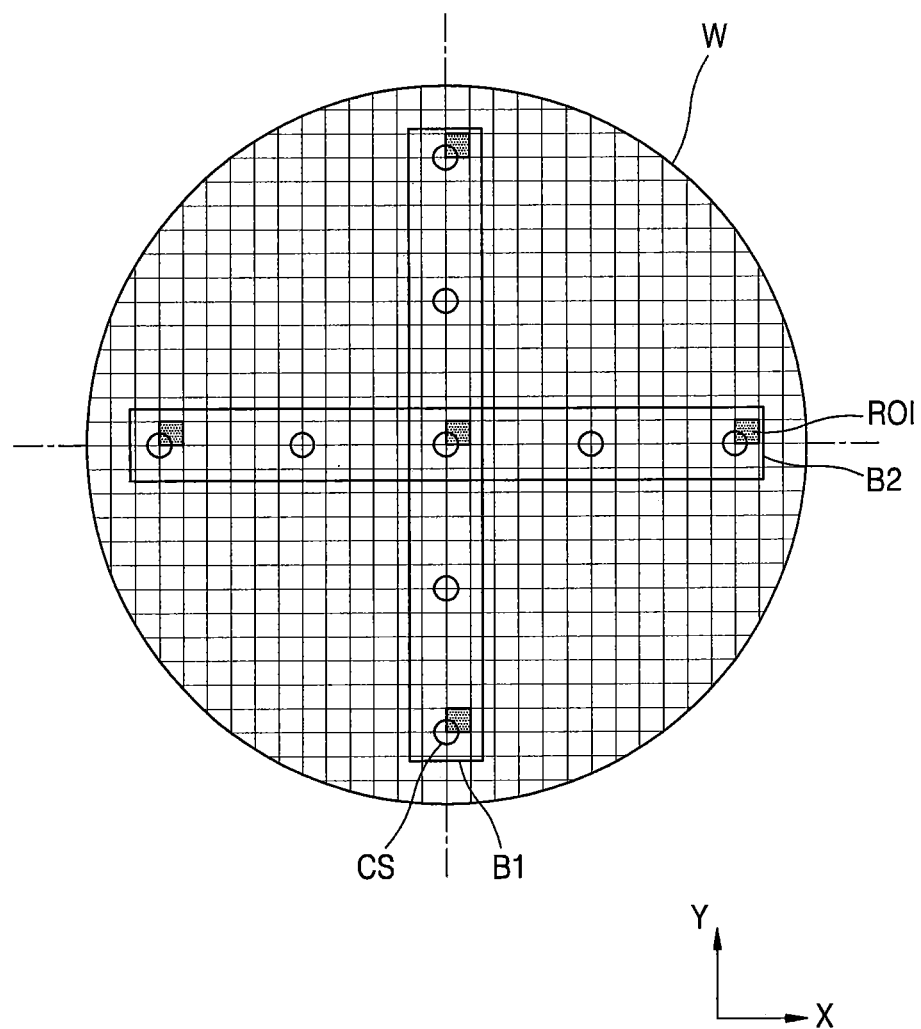

FIGS. 17A and 17B are views illustrating a comparison of alignment directions of electron beam columns on an ROI according to a general case and example embodiments. In other words, FIGS. 17A and 17B illustrate an inspection method of an ROI having five points by using a plurality of electron beam columns C1 to C5 that are disposed in a row.

Referring to FIGS. 17A and 17B, the five points on the wafer W may be designated as the ROI.

Referring to FIG. 17A, when the ROI having the five points is inspected by a general wafer inspection method, three points in the middle of the ROI are capable of being simultaneously inspected by a first scanning process A1, however, each one point of left and right in the ROI is capable of being respectively inspected by second and third scanning processes A2 and A3, the wafer is scanned a total of three times.

Referring to FIG. 17B, when the ROI having the five points is inspected by the wafer inspection method 400 according to example embodiments, three points in the middle of the ROI are simultaneously inspected by a first scanning process B1 in a Y-direction, and another three points in the middle of the ROI are simultaneously inspected by a second scanning process B2 in a X-direction by rotating a plurality of electron beam columns CS, thus scanning twice in total will be performed. Therefore, when the scanning of five points as the ROI is performed, the wafer inspection method 400 according to example embodiments may reduce the inspection time about 67% of that of the general wafer inspection method.

FIG. 17B illustrates that alignment directions of the electron beam columns CS rotates, but the present example embodiments are not limited thereto. In some embodiments, the wafer W may rotate corresponding to the alignment directions of the electron beam columns CS. In this case, the wafer W may be rotated by a rotation stage disposed on a lower portion of the stage.

Figure 18A:
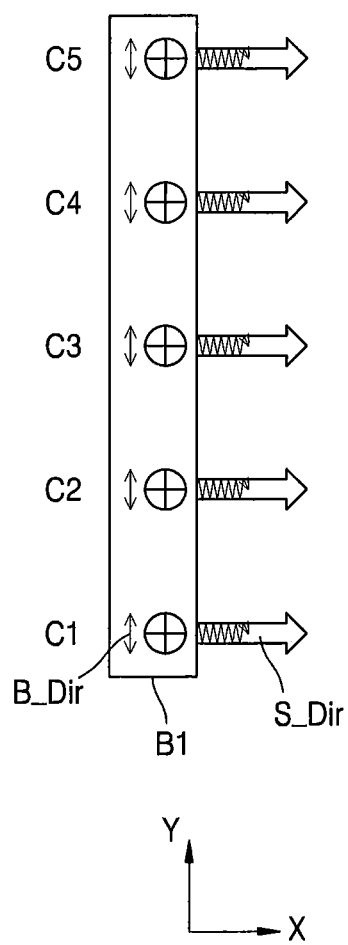
FIGS. 18A, 18B and 18C are views illustrating scanning a stage according to an example embodiment and scanning directions of a plurality of electron beam columns.
Figure 18B:
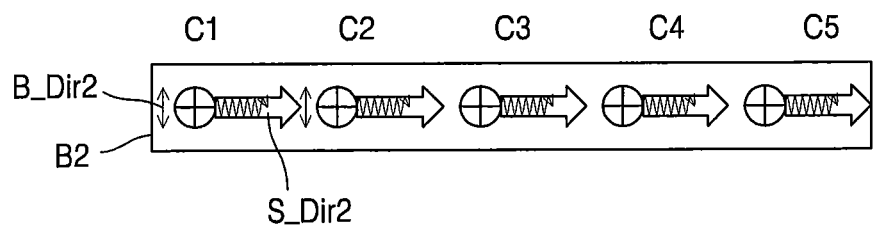
Figure 18C:
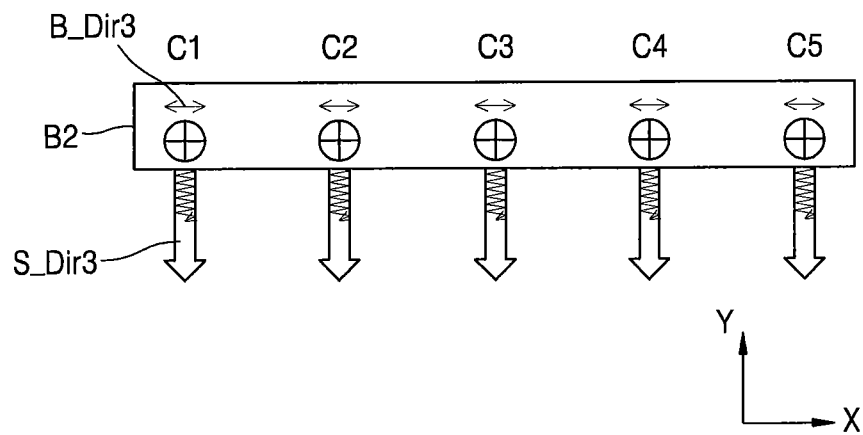

FIGS. 18A and 18B are views illustrating scanning a stage according to example embodiments and scanning directions of a plurality of electron beam columns.

Referring to FIGS. 17A, 17B and 18A, scanning directions B_Dir of the electron beam columns and a scanning direction S_Dir of scanning the stage of when the first scanning process B1 is performed are illustrated therein. A scanning direction S_Dir1 of the stage is perpendicular to any edge of a die and scanning directions B_Dir1 of the electron beam columns are perpendicular to the scanning direction S_Dir of scanning the stage.

Referring to FIGS. 17A, 17B, 18B and 18C, scanning directions B_Dir2 of the electron beam columns and a scanning direction S_Dir2 of the stage of when the second scanning process B2 is performed are illustrated therein, in which any one of the scanning directions B_Dir of the electron beam columns and the scanning direction S_Dir of scanning the stage in the first scanning process B1 is rotated by 90 degree and adjusted such that scanning directions B_Dir2 and B_Dir3 of the electron beam columns and scanning directions S_Dir2 and S_Dir3 of the stage are perpendicular to each other.

When the alignment directions of the electron beam columns C1 to C5 are rotated by 90 degree according to the second scanning process B2, the scanning directions of the electron beam columns and the scanning direction of the stage become the same, thus, the scanning directions of the electron beam columns should be rotated by 90 degree. Therefore, the scanning directions B_Dir2 of the electron beam columns and the scanning direction S_Dir2 of the stage may be perpendicular to each other. Meanwhile, the scanning directions B_Dir3 of the electron beam columns and the scanning direction S_Dir3 of the stage may be perpendicular to each other by rotating the scanning direction of the stage by 90 degree.

Figure 19A:
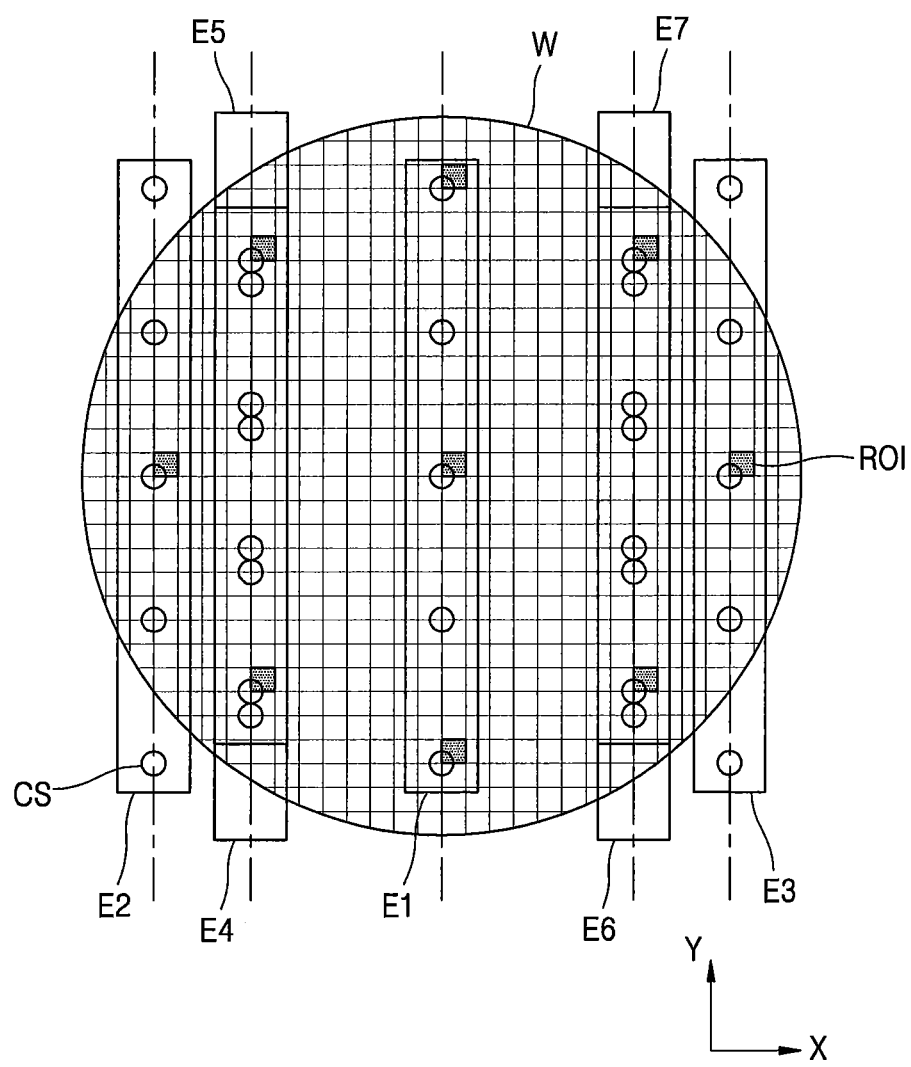
FIGS. 19A and 19B are views illustrating a comparison of alignment directions of electron beam columns on an ROI according to a general case and an example embodiment.
Figure 19B:
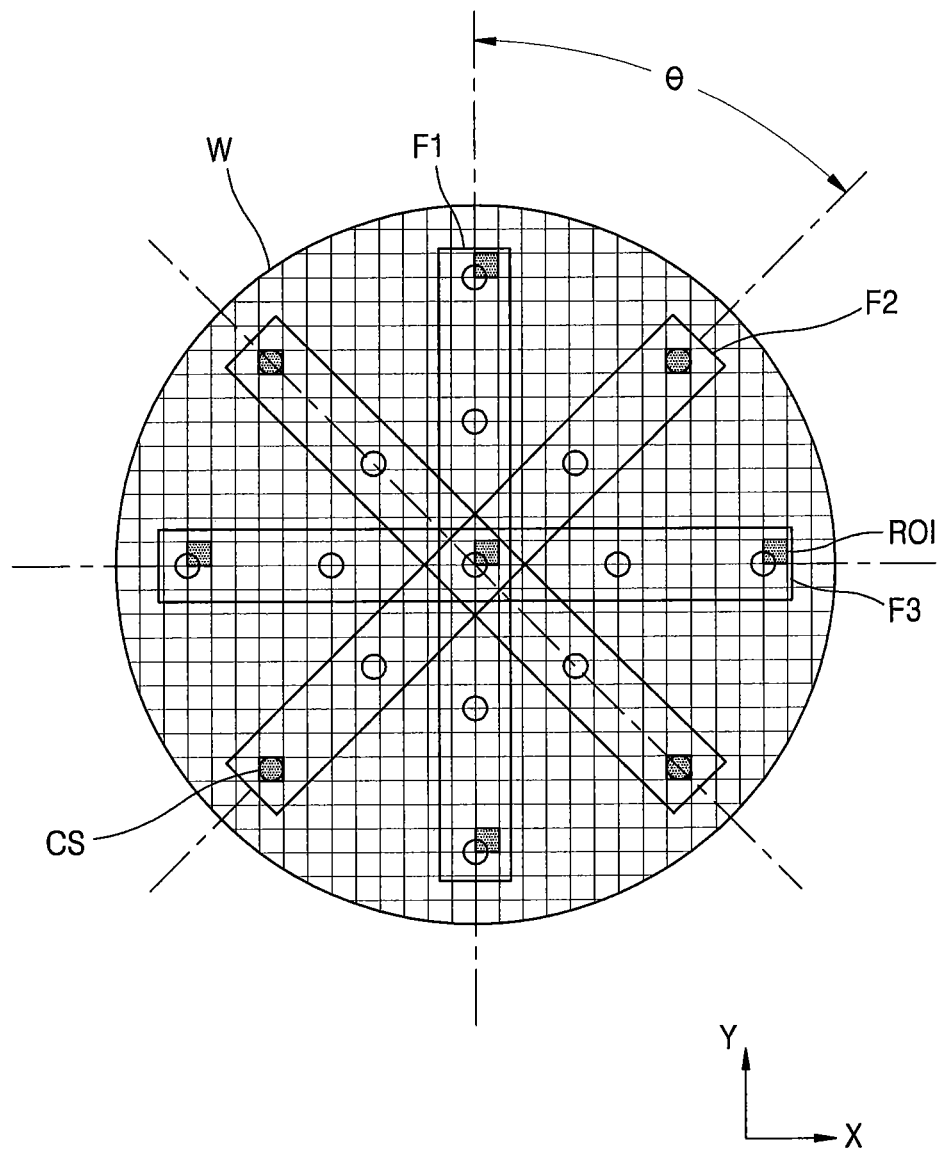

FIGS. 19A and 19B are views illustrating a comparison of alignment directions of electron beam columns on an ROI according to a general case and example embodiments. In other words, FIGS. 19A and 19B illustrate an inspection method of an ROI having nine points by using a plurality of electron beam columns CS that are disposed in a row.

Referring to FIGS. 19A and 19B, the nine points on the wafer W may be designated as the ROI.

Referring to FIG. 19A, when the ROI having the nine points is inspected by a general wafer inspection method, three points in the middle of the ROI are capable of being simultaneously inspected by a first scanning process E1, however, each one point of left and right in the ROI is capable of being respectively inspected by second and third scanning processes E2 and E3. Furthermore, when two points of left and right in a part excluding the middle portion and both end points thereof, additional scanning processes, that is, fourth, fifth, sixth, and seventh scanning processes E4 to E7, which corresponding to each of the points are required due to non-matching of intervals between the electron beam column and an interval between the two points. Thus, scanning seven times in total will be performed according to a general wafer inspection method.

Referring to FIG. 19B, when the ROI having the nine points is inspected by the wafer inspection method 400 according to example embodiments, three points in the middle of the ROI are simultaneously inspected by a first scanning process F1 in a Y-direction, and another three points in the middle of the ROI are simultaneously inspected by a second scanning process F2 by rotating the electron beam columns CS by a specific angle θ, furthermore, the other three points in the middle of the ROI are simultaneously inspected by a third scan F3 by rotating the electron beam columns CS in a X-direction. In other words, by the wafer inspection method 400 according to example embodiments, the ROI having the nine points may be inspected by scanning three times in total.

Therefore, when the scanning of the nine points as the ROI is performed, the wafer inspection method 400 according to example embodiments may reduce the inspection time about 43% of that of the general wafer inspection method.

FIG. 19B illustrates that alignment directions of the electron beam columns CS rotate, but the present example embodiments are not limited thereto. In some embodiments, the wafer W may rotate corresponding to the alignment directions of the electron beam columns CS. In this case, the wafer W may be rotated by a rotation stage disposed on a lower portion of the stage.

Figure 20:
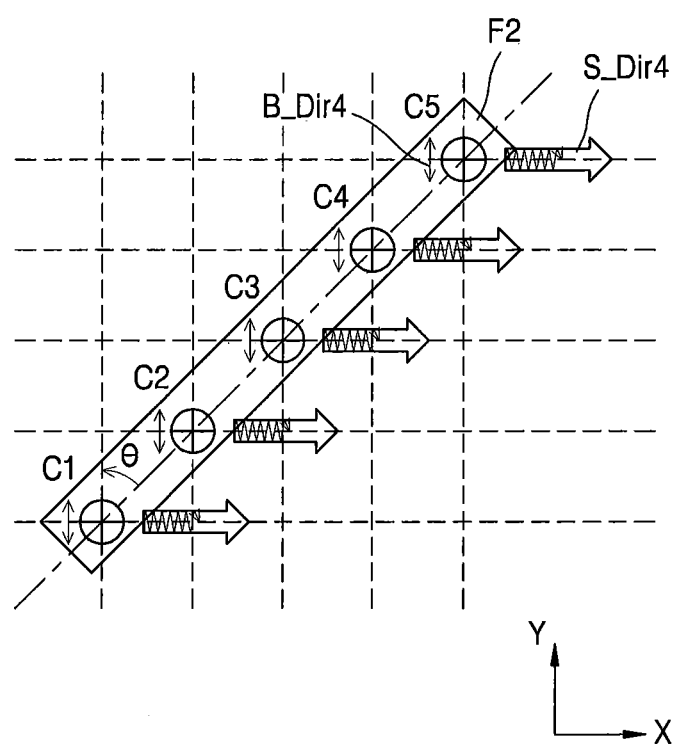
FIG. 20 is a view illustrating scanning a stage according to example embodiments and scanning directions of a plurality of electron beam columns.

FIG. 20 is a view illustrating scanning a stage according to example embodiments and scanning directions of a plurality of electron beam columns.

Referring to FIG. 20, scanning directions B_Dir4 of the electron beam columns and a scanning direction S_Dir4 of the stage of when a second scanning process F2 is performed are illustrated therein. The second scanning process F2 rotates alignment directions of electron beam columns C1 to C5 in a first scanning process F1 by a specific angle θ. Accordingly, as the scanning directions of the electron beam columns are not perpendicular to the scanning direction and an edge direction of the stage, a rotation in the scanning directions of the electron beam columns is required.

The scanning directions B_Dir4 of the electron beam columns may rotate in the opposite direction by the specific angle θ by which the alignment directions of the electron beam columns rotate. Accordingly, the scanning directions B_Dir4 of the electron beam may be perpendicular to the scanning direction S_Dir4 and the edge direction of the stage, and thus a boundary of an image obtained by scanning may match with an edge boundary of a die.

According to a wafer inspection method of example embodiments, a die image may be obtained in a short amount of time by combining respectively scanned partial images again by a plurality of electron beam columns. Furthermore, when a plurality of dies are an ROI, an inspection time of the dies will be reduced by rotating an alignment direction of the wafer or alignment directions of the electron beam columns and being capable of scanning much more of the dies.

While the inventive concept has been particularly shown and described with reference to example embodiments thereof, it will be understood that various changes in form and details may be made therein without departing from the spirit and scope of the following claims.

What is claimed is:

1. A method of inspecting a wafer, comprising:
   loading a wafer onto a stage, the wafer having a plurality of dies thereon;
   positioning the wafer such that a plurality of spaced-apart electron beam columns face a corresponding plurality of spaced-apart and different partial regions on the plurality of dies;

scanning the plurality of different partial regions on the plurality of dies in parallel using the plurality of spaced-apart electron beam columns to thereby generate a corresponding plurality of partial images of the plurality of dies, wherein the plurality of partial regions included in a first die of the plurality of die completely constitutes the first die; and combining the plurality of partial images of the plurality of dies to generate an image of a composite die defined by the plurality of partial images.

2. The method of claim 1, wherein the positioning of the wafer comprises rotating the wafer.

3. The method of claim 2, further comprising:
rotating scanning directions of the stage and the electron beam columns until the scanning direction of the stage is perpendicular to an edge of at least one of the dies and the scanning directions of the electron beam columns are perpendicular to the scanning direction of the stage.

4. The method of claim 3, wherein a rotation angle of the scanning directions of the stage and a rotation angle of the scanning directions of the electron beam columns are equal to a rotation angle of the wafer.

5. The method of claim 3, wherein a rotation angle of the scanning directions of the stage is determined based on movement speeds of the stage in an X-axis direction and a Y-axis direction of the stage.

6. The method of claim 2, wherein the positioning of the wafer is simultaneously performed with the loading by loading the previously rotated wafer on the stage.

7. The method of claim 2, wherein the wafer is rotated by a rotation stage formed on the stage.

8. The method of claim 1, wherein the positioning of the wafer comprises rotating alignment directions of the electron beam columns.

9. The method of claim 8, further comprising rotating scanning directions of the electron beam columns until the scanning directions of the electron beam columns are perpendicular to a scanning direction of the stage.

10. The method of claim 1, wherein said combining is followed by detecting a defect in the composite die by comparing the image of the composite die with design data.

11. A method of inspecting a wafer, comprising:
generating a plurality of electron beam columns such that each of the plurality of electron beam columns face a corresponding partial region of each of a plurality of dies on the wafer;
scanning the corresponding partial region of each of the plurality of dies, in parallel, using the plurality of electron beam columns to thereby generate a scanned image of each of the corresponding partial regions of the plurality of dies, wherein the scanned image of each of the corresponding partial regions of each of plurality of dies do not overlap each other; and
combining the scanned image of each of the corresponding partial regions of the plurality of dies into a complete image of a die comprising distinct portions of each of the plurality of dies scanned by the plurality of electron beam columns.

12. The method of claim 11, wherein the scanning comprises rotating scanning directions of at least one of a stage on which the wafer is positioned and the electron beam columns until a scanning direction of the stage is perpendicular to an edge of at least one of the dies and the scanning directions of the electron beam columns are perpendicular to the scanning direction of the stage.

13. The method of claim 11, further comprising comparing the complete image of the die to design data, and detecting a defect pattern based on the comparison.

14. The method of claim 13, further comprising identifying at least one pattern group that is displayed repeatedly in the design data and determining a defect ratio of the at least one pattern group through the defect of the pattern displayed in the complete image of the die.

15. A wafer inspection method, comprising:
scanning, in parallel, a first of partial region of a first die and second partial region of second die within the wafer using a corresponding plurality of spaced-apart electron beam columns, to generate first partial image of the first partial region of the first die and second partial image of the second partial region of the second die, wherein the first and second dies are equally designed and the first and second partial regions are differently designed; and
attaching the first and second partial images into a composite image of a die, said composite image comprising the first partial image of the first die and the second partial image of the second die.

16. The method of claim 15, wherein the first and second dies have equivalent layouts of integrated circuits therein.

17. The method of claim 16, wherein the first partial image of the first die is of a first region of the first die; wherein the second partial image of the second die is of a second region of the second die; and wherein the first and second regions are immediately adjacent regions within the composite image of a die.

18. The method of claim 17, further comprising comparing the composite image of the die to design data and detecting a defect pattern based on the comparison.

19. The method of claim 15, further comprising comparing the composite image of the die to design data and detecting a defect pattern based on the comparison.

20. The method of claim 15, wherein the first partial image of the first die is of a first region of the first die; wherein the second partial image of the second die is of a second region of the second die; and wherein the first and second regions are immediately adjacent regions within the composite image of a die.

* * * * *